United States Patent [19]

Lowe

[11] Patent Number: 5,583,461
[45] Date of Patent: Dec. 10, 1996

[54] INTERNAL CLOCK SIGNAL GENERATION CIRCUIT HAVING EXTERNAL CLOCK DETECTION AND A SELECTABLE INTERNAL CLOCK PULSE

[75] Inventor: William M. Lowe, Austin, Tex.

[73] Assignee: Advanced Micro Devices, Inc., Sunnyvale, Calif.

[21] Appl. No.: 308,351

[22] Filed: Sep. 19, 1994

[51] Int. Cl.$^6$ ............................. H03K 5/13; H03K 3/284
[52] U.S. Cl. ............................. 327/172; 327/99; 327/299
[58] Field of Search ..................................... 327/172, 173, 327/174, 175, 176, 26, 34, 31, 299, 36, 37, 152, 298, 99, 227

[56] References Cited

U.S. PATENT DOCUMENTS

| | | | |
|---|---|---|---|
| 4,341,964 | 7/1982 | Chi et al. | 327/26 |
| 4,355,283 | 10/1982 | Ott | 327/172 |
| 4,637,018 | 1/1987 | Flora et al. | 327/99 |
| 4,965,524 | 10/1990 | Patchen | 327/99 |
| 4,970,405 | 11/1990 | Hagiwara | 327/141 |
| 4,982,116 | 1/1991 | Lee | 327/298 |
| 5,003,194 | 3/1991 | Engelhard | 327/173 |
| 5,027,046 | 6/1991 | Beg | 327/26 |
| 5,059,818 | 10/1991 | Witt et al. | 327/172 |
| 5,103,185 | 4/1992 | Arai | 327/99 |
| 5,254,888 | 10/1993 | Lee et al. | 327/152 |
| 5,418,486 | 5/1995 | Callahan | 327/310 |

FOREIGN PATENT DOCUMENTS

| | | | |
|---|---|---|---|
| 62-85511 | 4/1987 | Japan | 327/99 |
| 2272617 | 11/1987 | Japan | 327/99 |
| 5268020 | 10/1993 | Japan | 327/99 |

Primary Examiner—Timothy P. Callahan
Assistant Examiner—Eunja Shin
Attorney, Agent, or Firm—Kevin L. Daffer; Conley, Rose & Tayon

[57] ABSTRACT

An internal clock generation circuit is provided for receiving an external clock signal. Based upon the duration of each high and low pulse width of the external clock signal, the internal clock generation circuit selects one of two possible clock signals as an internal clock signal for connection to a load device. Selection is based upon whether the high and low pulse durations of the external clock signal exceed or are less than a threshold amount. If exceeded, the external clock signal connects a longer duration pulse width internal clock signal to the load device. If less than, the internal clock signal connects a shorter duration internal clock signal to the load device. Accordingly, the internal clock generation circuit allows for variability in the external clock signal frequency and duty cycle and correspondingly selects one of two (and possibly more) clock signals for connection to the load device. Detection and selectability allows for load device operation at speeds less than maximum designed amounts in order to salvage slower speed devices and improve wafer yield.

9 Claims, 4 Drawing Sheets

INTERNAL CLOCK SIGNAL GENERATION CIRCUIT HAVING EXTERNAL CLOCK DETECTION AND A SELECTABLE INTERNAL CLOCK PULSE

BACKGROUND OF THE INVENTION

1. Field of the Invention

This invention relates to an electronic circuit and more particularly to an internal clock signal generation circuit having external clock detection and a selectable internal clock pulse.

2. Description of the Relevant Art

Circuits used for generating a plurality of clocking pulses are often referred to as clocking circuits. Clocking circuits are beneficial in setting the operating speed of a system, or one or more devices within the system. Clocking pulses output from the clocking circuit must oftentimes undergo shaping or some form of filtration to ensure a stream of pulses more readily received by a load device.

A popular form of wave shaping or filtration involves use of a phase-locked loop (PLL). PLLs operate by detecting an input stream of pulses and locking upon the input pulses (in phase and frequency) using a low pass filter and voltage controlled oscillator connected in a feedback configuration. The input pulses are thereby operated upon by the PLL to present an output stream of pulses with similar phase and frequency as the input pulses but at a more consistent frequency and duty cycle for the duration of the input pulses. Thus, PLLs are used to filter out short term fluctuations in the input stream of pulses in order to present a stream of output pulses more suitable to an output-connected load device. As defined hereinbelow, input pulses are referred to as those pulses within an external clock signal, and output pulses are those pulses within an internal clock signal. It is therefore appreciated that the internal clock signal is oftentimes dissimilar from the external clock signal. The internal clock signal is generally tuned to match the operating characteristics of the load device.

A problem often encountered with PLLs is their inherent delay in locking onto the external clock signal. PLLs require passage of numerous external clock pulse cycles before an internal clock signal is generated having a frequency and phase similar to the external clock signal. While PLLs achieve good wave shaping and consistent filtration of external clock signal fluctuation, PLLs are inadequate if instantaneous or near instantaneous internal clock signal generation is required. In many instances, manufacturer specification requires the internal clock signal to track the external clock signal between static and dynamic frequency. Tracking must occur "on the fly" with minimal delay between application of external clock signal and generation of internal clock signal. Wave shaping and frequency/phase fluctuation filtration techniques of PLLs is therefore needed without PLL start-up delay.

One way in which to achieve wave shaping with nearly instantaneous internal clock signal generation is to use a monostable multivibrator coupled between the external clock signal and the internal clock signal. The monostable multivibrator (often referred to as a "one-shot") triggers from the leading or falling edge of each pulse within the external clock signal and provides a set duration pulse thereafter. An illustration of one-shot 10 placed between external clock signal and internal clock signal is illustrated in FIG. 1. Provided the external clock signal maintains a constant frequency, the one-shot circuit assures that duty cycle of the internal clock signal will also remain constant.

One-shot 10 is preferred over a PLL not only for its on-the-fly tracking of the external clock during start-up, but also for its tunability to the internal timing specification of the load device 12. Specifically, one-shot 10 is designed to change to a quasi-stable state for a fixed period of time, and the fixed period of time is set to exceed the worst-case speed path within load device 12. By setting the quasi-stable state of one-shot 10 to a duration greater than the worst-case speed path, load device 12 is assured of operability. However, the quasi-stable state must not be too high, as would cause the stable state duration to be less than the worst-case speed path. As defined herein, worst-case speed path refers to a time duration necessary to propagate a signal through the path, wherein the path is one having the greatest delay through micro components arranged between two clocked elements within the load device.

FIG. 2 helps illustrate the advantages as well as the disadvantages of using a one-shot for generating an internal clock signal. As shown, a one-shot triggers from one edge (a leading edge as shown in the example of FIG. 2) of external clock signal at time T1. Regardless of the duration of the external clock signal pulse, the quasistable state will continue from T1 to a fixed duration time T2 thereafter. The process is repeated at each leading edge of pulses within external clock signal to present an internal clock signal of fixed high (or low) pulse duration. As defined herein, high pulse refers to a voltage magnitude which is greater than the magnitude of a low pulse. The magnitude of the low pulse is therefore closer to ground potential than the magnitude of the high pulse.

The duration of the quasi-stable state of one-shot 10 is shown in FIG. 2 as reference numeral 14. Regardless of the external clock signal operating frequency (either frequency F1 or frequency F2), quasi-stable state 14 remains constant. Preferably, quasi-stable state duration 14 is fixed at or near a 50% duty cycle for higher frequency operation F2. By defining quasi-stable state duration to exceed worst-case speed path in a 50% or near 50% duty cycle, a maximum external clock signal can be defined (e.g., maximum frequency F2) to drive load device 12. A problem often presents itself, however, whenever wafer fabrication process variability occurs. If a wafer is fabricated embodying load device 12 which cannot operate at a specified speed value, then it may be incapable of operating at the chosen quasi-stable state duration 14. The die tested upon a wafer which fails maximum speed requirements set by one-shot quasi-stable state must therefore be discarded. Even if the operator slows the frequency of the external clock signal, the internal clock signal quasi-stable state duration 14 nonetheless remains constant—at a time duration less than the operable speed of the die. The die would only operate correctly if the one shot quasi-stable state duration is increased.

Accordingly, the defective die are determined solely from the operating characteristics of one-shot 10, regardless of user-defined application. There may be instances in which the user does not require a fast external clock signal and would be quite content with lowering the external clocking frequency if the price of the load device is lessened. It would therefore be advantageous to provide means for salvaging die having load devices which may not operate at maximum frequency, but which operate at some frequency below maximum. For those load devices which operate at lower frequencies, it would be desirable to lessen the external clock signal frequency and provide a longer duration quasi-stable state. The newly defined internal clock signal quasistable state duration would correspondingly be greater than the worst-case speed path of the slower operating die (load device).

SUMMARY OF THE INVENTION

The problems outlined above are in large part solved by an internal clock generation circuit of the present invention. The internal clock generation circuit hereof is suited for detecting pulse width within each cycle of the external clock signal and, based upon that pulse width, selecting a long or short internal clock pulse width for connection to a load device. For example, if the high pulse width of the external clock signal exceeds a threshold amount (possibly indicating a slower external clocking frequency), then the internal clock signal generation circuit hereof will generate a longer high pulse width internal clock signal for connection to the load device. Thus, the internal clock signal generation circuit allows a user to select a slower external clock for the above-mentioned circumstance and pass the slower signal onto the load device in the form of a slower internal clock signal. If the load device can operate at a faster frequency, then the internal clock signal generation circuit generates and connects an internal clock signal of shorter pulse width duration to the load device. The shorter pulse width duration internal clock signal is thereby capable of modulating the load device at maximum frequency, if so desired.

The internal clock signal generation circuit can therefore be used to allow variability in external clock signal frequency commensurate with user-defined applications. Variability in external clock signal frequency is advantageously used to allow salvage of die which cannot operate a maximum frequency, yet can operate at some frequency less than maximum. The slower operating die (load devices) are adequately driven by connection of a longer duration pulse width internal clock signal to the load device. In all instances, however, a maximum operating frequency of the load device is defined by a threshold duration value set by the internal clock generation circuit. The threshold duration value is tuned to the worst-case speed path of the load device. Thus, the internal clock generation circuit achieves the benefits of a one-shot wave shaping circuit without the problems of PLLs. Additionally, the internal clock generation circuit hereof exceeds conventional one-shot internal clock generation techniques by allowing variability in external clock frequency carried forward to die (load device) operation. As such, the present circuit is used to enhance wafer yield by allowing die of slower operating speeds to be salvaged as workable devices in user-defined slower environments.

Broadly speaking, the present invention contemplates an internal clock signal generation circuit. The internal clock signal generation circuit includes a pulse width detector coupled to receive an external clock signal and compare an external clock pulse for each cycle of the external clock signal to a threshold time amount. The internal clock signal generation circuit further includes a pulse width generator connected to the pulse width detector for generating an internal clock signal and, depending upon the comparison of the external clock pulse to the threshold time amount, for connecting the internal clock signal to a load device.

The pulse width detector comprises a decision logic circuit for producing a select signal corresponding to the comparison of the external clock pulse to the threshold time amount. The internal clock signal comprises one of two possible clocking signals of dissimilar pulse width durations. One of the two possible clocking signals includes a pulse width at each clocking signal cycle which is of equal duration to the threshold time amount. Furthermore, one of the two possible clocking signals is selected by a multiplexer coupled between the pulse width detector and the pulse width generator.

The present invention further contemplates an internal clock signal generation circuit comprising an external clock signal having an external clock high and low pulse for each cycle of the external clock signal. A pulse width detector is provided and coupled to receive the external clock signal and compare a duration of the external clock high pulse with a threshold time amount as well as compare a duration of the external clock low pulse with the threshold time amount. The pulse width detector is adapted for producing a select signal corresponding to the comparison of the threshold time amount with the external clock high pulse and with the external clock low pulse. Thus, the comparison is separately performed on the high as well as on the low pulse durations for each cycle of the external clock signal. First and second pulse width generators are provided and coupled to receive the external clock signal and produce a respective first and second internal clock high pulse. A multiplexer is coupled to receive the select signal and the first and second internal clock high pulse and, based upon the select signal value, the multiplexer is adapted for connecting the first internal clock high pulse to a load device if the duration of the external clock high pulse is less than a threshold amount. In the alternative, the multiplexer is adapted for connecting the first internal clock high pulse to the load device if the duration of the external clock low pulse is less than the threshold amount. Also, in the alternative, the multiplexer is adapted for connecting the second internal clock high pulse to the load device if the duration of the external clock high pulse is greater than the threshold amount. Still further in the alternative, the multiplexer is adapted for connecting the second internal clock high pulse to the load device if the duration of the external clock low pulse is greater than the threshold amount.

The pulse width detector includes a delay circuit coupled to receive the external clock high and low pulse and produce a delayed external clock high and low pulse. The delayed external clock high and low pulse is delayed from the external clock high and low pulse by an amount equal to the threshold time amount. A logic gate is coupled to receive the external clock high and low pulse and the delayed external clock high and low pulse. The logic gate is adapted for producing a binary signal corresponding to the presence or absence of timed overlap of the external clock high and low pulse with that of the respective delayed external clock high and low pulse. A latching circuit is coupled to receive the binary signal, delay the binary signal by one clock cycle of the external clock, and produce a latched select signal. The first and second pulse width generators include first and second latching circuits, each latching circuit having a set input and a delayed reset input. The delayed reset input of the second latching circuit is delayed longer than the delayed reset input of the first latching circuit.

BRIEF DESCRIPTION OF THE DRAWINGS

Other objects and advantages of the invention will become apparent upon reading the following detailed description and upon reference to the accompanying drawings in which.

Figure 1:
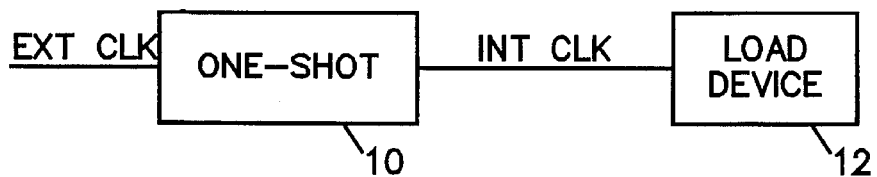
FIG. 1 is a block diagram of a monostable multivibrator (one-shot) of unitary quasi-stable state connected between an external and internal clock signal according to a prior art design.
Figure 2:
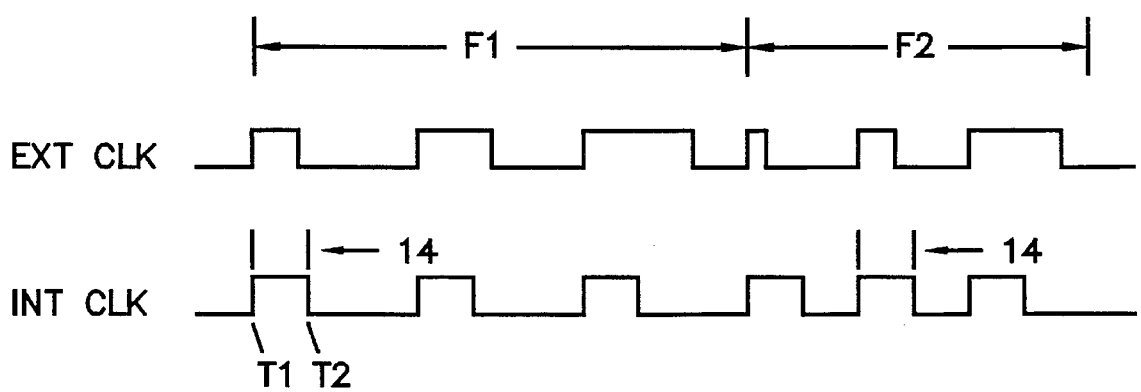
FIG. 2 is a timing diagram of the external and internal clock signals according to the prior art design.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 3:
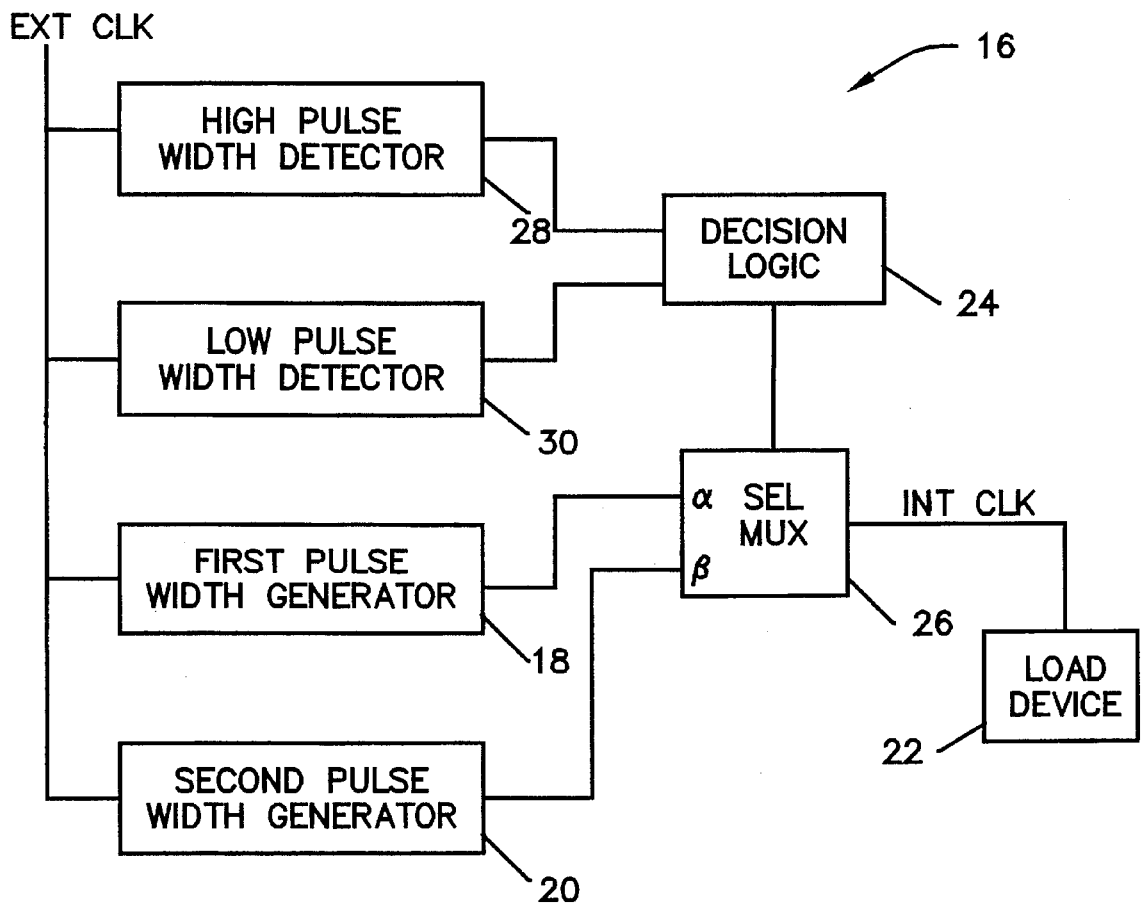
FIG. 3 is a block diagram of an internal clock signal generation circuit according to the present invention.

A block diagram of internal clock signal generation circuit 16 of the present invention is shown in FIG. 3. Circuit 16 receives an external clock signal and shapes that signal in order to produce one of two possible internal clock signals. The internal clock signals are triggered from the external clock signal and are produced at the output of first pulse width generator 18 and second pulse width generator 20. Decision as to which of the internal clock signals (either output from generator 18 or generator 20) for connection to load device 22 is made by decision logic 24 and multiplexer 26. Multiplexer 26 has two inputs, $\alpha$ and $\beta$, coupled to the outputs of generators 18 and 20. Decision logic 24 has an output coupled to the select input of multiplexer 26 and controls whether or not the internal clock signal $\alpha$ or internal clock signal $\beta$ is connected as internal clock signal to load device 22 via multiplexer 26.

Decision logic 24 is controlled by the output of high pulse width detector 28 and low pulse width detector 30. High pulse width detector detects the width (duration) of each high pulse of each cycle of the external clock signal, wherein low pulse detector 30 detects each low pulse width (duration) of each cycle of the external clock signal. Thus, as the external clock signal propagates to the detectors 28 and 30, the detectors determine whether or not each high and low pulse width exceeds or is less than a threshold amount. If either is less than a threshold amount, then decision logic 24 selects the $\alpha$ input of multiplexer 26. If the high and low pulse width durations each exceed the threshold amount, then decision logic 24 selects $\beta$ input of multiplexer 26.

Generally speaking, the operator can change frequency and/or duty cycle of the external clock signal, and detectors 28 and 30 can detect that change and make a decision as to whether one or the other ($\alpha$ or $\beta$) signals are connected as an internal clock signal to load device 22. Accordingly, internal clock generator circuit 16 detects the external clock signal, allows operator variability of that signal, generates two (or possibly more) clock signals, and selects those clock signals for connection as an internal clock signal to a load device. Circuit 16 thereby achieves advantages of user selectability for desired application and can provide product (load device embodied upon wafer die) categorization in order to salvage product which is nonoperable in speed only, as opposed to completely nonoperable product at any speed.

Figure 4:
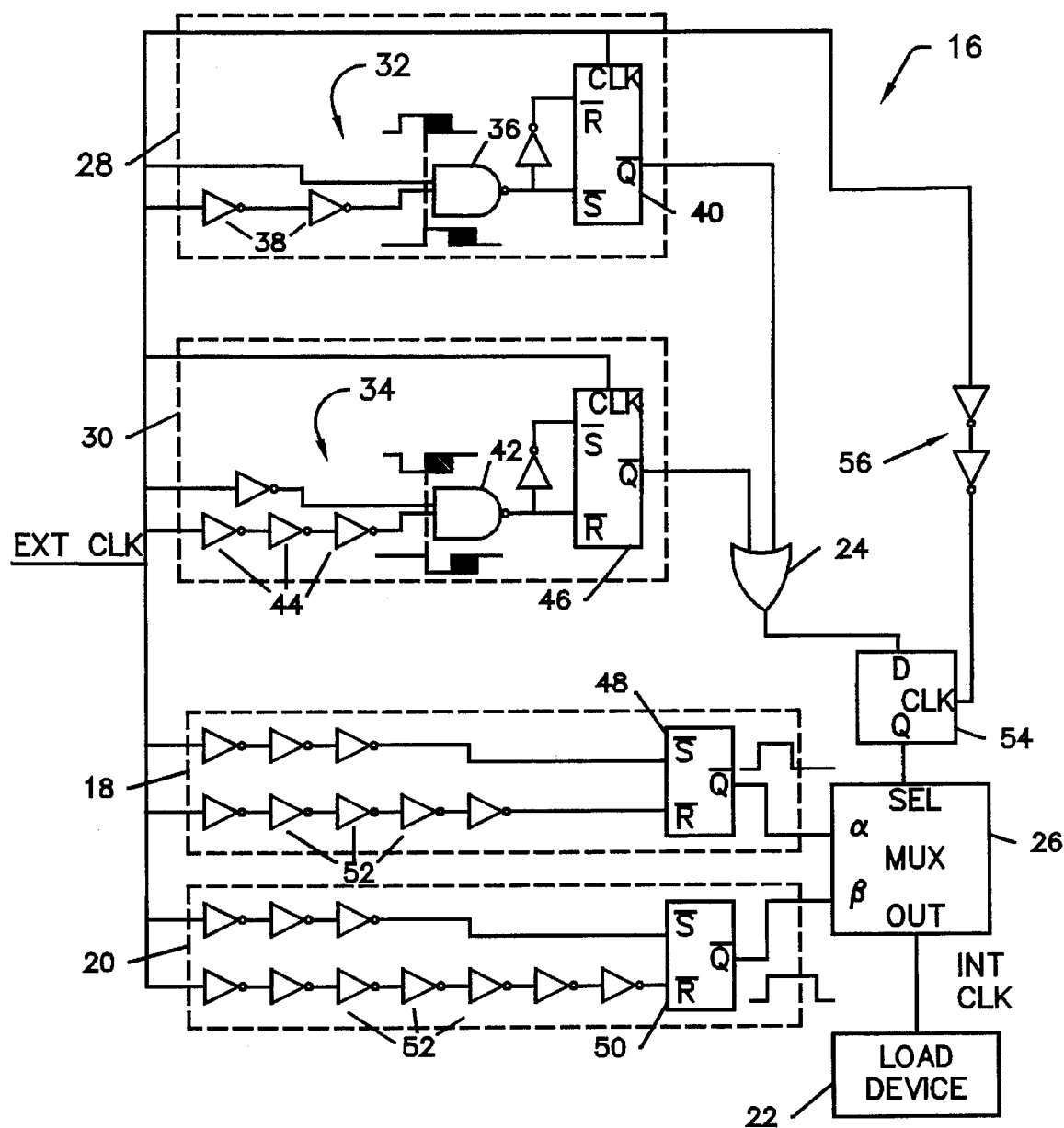
FIG. 4 is a circuit schematic of the internal clock signal generation circuit according to the present invention.

Referring now to FIG. 4, a circuit schematic of the block diagram of FIG. 3 is shown. Specifically, FIG. 4 illustrates one exemplary circuit schematic necessary to carry out the functional blocks shown in FIG. 3. It is appreciated that the circuit schematic can be varied in structure yet provide the same functional outcome as that shown in FIG. 3. It is also appreciated that all such variations in circuit structure fall within the spirit and scope of the present invention.

One way in which to achieve detection of external clock signal high and low pulse width is to use a delay circuit. Detector 28, as well as detector 30, each include respective high and low pulse delay circuits 32 and 34. High pulse delay circuit 32 comprises a nand gate 36 having two inputs, wherein one input is connected to the external clock signal and the other input is connected to a series-connected pair of invertors 38. Invertors 38 provide propagation delay of a threshold duration amount. If the high pulse duration of external clock signal exceeds that threshold amount, as shown by the waveforms proximate to nand gate 36, then nand gate 36 output will be at a logic low; otherwise, nand gate 36 output will be at a logic high. A logic low output of nand gate 36 will set latch 40 output to a logic low value.

Low pulse delay circuit 34 functions similar to high pulse delay circuit 32. Instead of triggering from the positive-going edge of the external clock signal, low pulse delay circuit 34 triggers from the negative-going edge. One input of nand gate 42 is delayed by series-connected trio of invertors 44. Invertors 44 delay the negative-going edge by a threshold amount necessary for detection of the duration of each low pulse of external clock signal. If the low pulse duration exceeds the threshold delay amount, then nand gate 42 will output a logic high value causing latch 46 to output a logic low value at the Q bar output.

As described above, if the high pulse width of the external clock signal and the low pulse width of external clock signal each exceeds the threshold amount, then a logic low value will be presented at both of the inputs of decision logic 24. If decision logic 24 includes an or gate, then the or gate will emit a low logic value to select input of multiplexer 26 causing selection of one input, (e.g., $\beta$ input) for connection to load device 22. Properly chosen, decision logic 24 receives both inputs of low logic value necessary to select the $\beta$ input. In such an example, a low logic input to decision logic 24 is caused by high and low pulse widths each exceeding a threshold amount, resulting in a $\beta$ clock signal connected as an internal clock signal to load device 22, wherein $\beta$ clock signal has wider (longer) pulse width than $\alpha$ clock signal.

Accordingly, high and low pulse width detectors 28 and 30 detect the relative pulse durations of each cycle of external clock signal and based on the comparison of those pulse widths to a threshold amount, determines a corresponding pulse width (either $\alpha$ or $\beta$) clock signal connection to load device 22. If the external clock signal has a longer duration high and low pulse width, then a longer duration pulse width $\beta$ clock signal can be chosen and connected to load device 22. Conversely, if a shorter duration high or low pulse width external clock signal is chosen, then a shorter duration $\alpha$ clock signal can be chosen and connected to load device 22. Variability and selectability of external and internal clock signals is therefore an important outcome of present generation circuit 16. First and second generators 18 and 20, respectively, generate respective $\alpha$ and $\beta$ clock signals. Generator 18 and generator 20 each comprise a one-shot circuit. The one-shot includes a set signal and a delayed reset signal input to respective latching circuit 48 and 50. By varying the number of series-connected invertors 52 connected to the reset input, more or less delay can be achieved. A greater delay is used for generator 20 reset input then that of generator 18 in order to provide a longer quasi-stable state for β clock signal then for α clock signal.

In order to time the arrival of signals to multiplexer, a latching circuit 54 can be used to hold the output from gate 24 upon the arrival of a delayed clocking signal from delay circuit 56. Thus, latching circuit operates to present an output to multiplexer 26 at the same time in which α and β signals arrive. Delay achieved by delay circuit 56 can be varied to carry out the necessary timed input to multiplexer 26.

Figure 5:
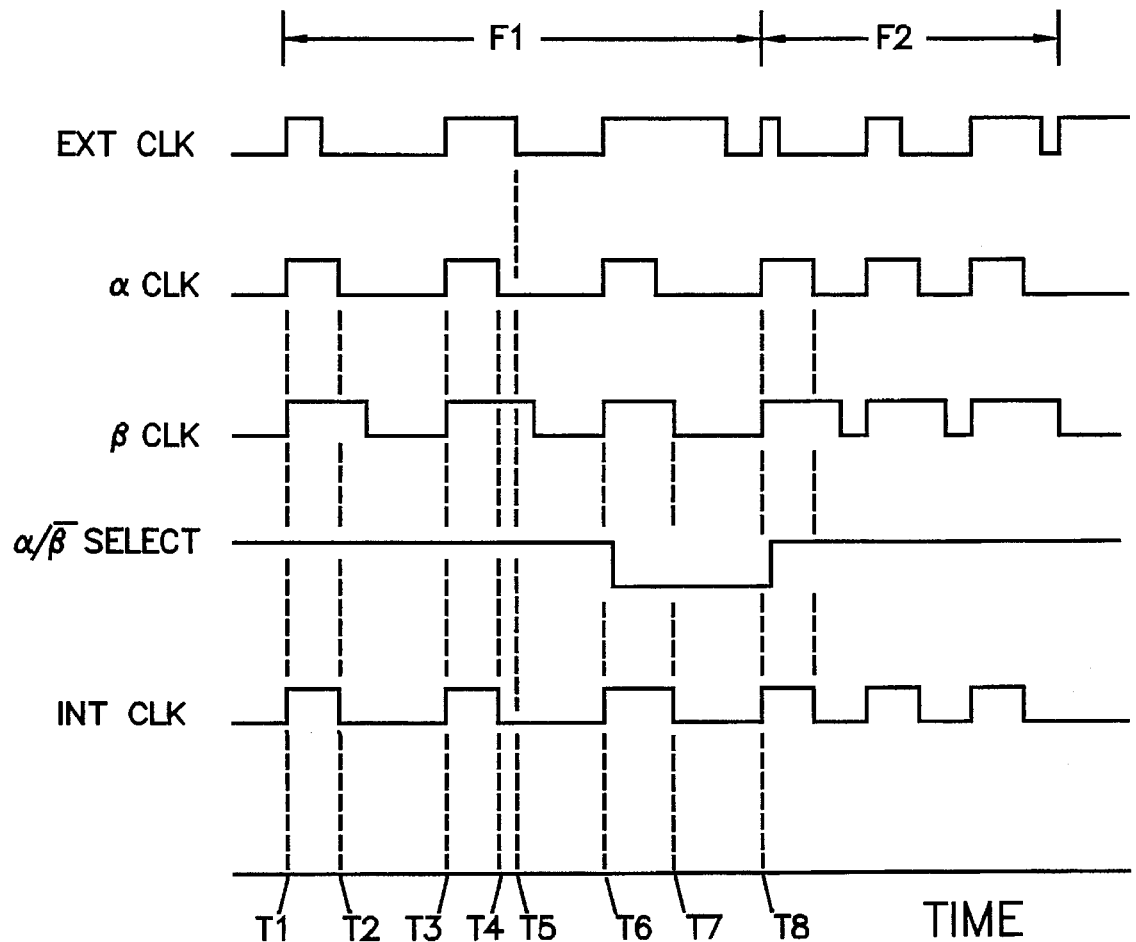
FIG. 5 is a timing diagram of the external and internal clock signals as well as other signals within the internal clock generation circuit of the present invention.

Referring now to FIG. 5, a timing diagram of the external and internal clock signals as well as other signals within circuit 16 are shown. As shown, the external clock signal can have variable frequency, F1 or F2, or variable duty cycles for each clock period. The α clock signal maintains a constant quasi-stable state and the β clock signal also maintains a constant quasi-stable state. The quasi-stable state of β exceeds in high pulse duration the α quasi-stable state. The α/β select signal is that which is placed on the input of multiplexer 26. If α/β select signal is high, then α clock signal (α CLK) will be connected through as internal clock signal (INT CLK). Conversely, if α/β select signal is low, then β clock signal (β CLK) will be passed through as internal clock signal.

If either the high or low pulse duration of external clock signal is less than a threshold amount (in the example shown, the high and low threshold amounts are each equal to the high pulse duration of the α internal clock), then the α/β select signal will transition at the next positive-going external clock edge to a high value. Conversely, if the external clock signal high and low pulse widths each exceed the threshold amount, then at the next positive-going external clock signal edge the α/β select signal will transition to a low value. To help illustrate this operation, timeline drawings are provided wherein α and β clock signals trigger at the positive-going edge of external clock signal at T1. If the α/β select signal is high, then internal clock signal will transition low corresponding with α clock signal at T2. The internal clock signal, as well as α and β clock signals transitions positive at time T3, triggered from the positive-going edge of the external clock signal. Since the α/β select signal remains high, internal clock signal will transition low, corresponding to α clock signal at time T4.

Turning again to FIG. 5, T6 indicates positive-going trigger of internal clock signal as well as α and β clock signals. The internal clock signal maintains its high value for a duration extending to T7. Time T7 corresponds with the negative-going edge of β clock. Thus, internal clock signal is selected from α clock signal to β clock signal. Selection from α to β clock signal occurs as the result of α/β select signal transition from a high to low state at a time slightly after time T6. Transition of α/β select signal arises from both the high and the low pulse width of external clock signal between times T3 and T6 exceeding the threshold duration of high pulse width α internal clock. Accordingly, a slower external clock signal or a clock signal having longer high or low pulse width durations can be carried forward to (with one clock delay thereafter) an internal clock signal and an enhanced internal clock signal having longer high pulse width as shown at times T6 to T7.

FIG. 5 illustrates that α clock signal high pulse duration can be set at a 50% duty cycle of a higher frequency (maximum frequency) external clock signal, as shown at F2. During maximum frequency, either the high pulse duration or the low pulse duration of external clock signal can be less than the threshold α clock signal high pulse duration. As such, α/β select signal remains at a high value indicative of selection of α clock internal signal connected as internal clock signal and enhanced internal clock signals at times after T8. Thus, at maximum frequency F2, internal clock signal and enhanced internal clock signal will maintain short duration high pulse width set at the worst-case speed path of load device 22, and the internal and enhanced internal clock signals will not transition to a longer duration high pulse width, such as that of β internal clock signal. Moreover, the internal and enhanced internal clock signals high pulse width will equal the threshold duration value of the α clock signal high pulse width and will not extend therebelow. A minimum threshold can therefore be maintained for higher frequency applications, however, if for some reason lower frequency applications are desired, the internal and enhanced internal clock signals can transition to a longer duration high pulse width associated with β clock signal.

It will be appreciated to those skilled in the art having the benefit of this disclosure that this invention is capable of applications with any clock-driven load device. In addition, it is understood that FIGS. 1 and 5 can include multiple sets of high and low pulse width detectors as well as multiple sets of first and second width generators. FIG. 5 indicates that waveforms of frequency F1 will not always select the β clock if high or low pulse widths do not exceed the thresholds. In this case, multiple high and low pulse width detector pairs can be employed. For example, a 50 Mhz clock signal has a period of 20 ns. If this is the β frequency, then ideally any external clock waveform of frequency 50 Mhz or less should select the β clock. To select the β clock, a number of high and low threshold pairs can be employed, with the β clock selected if any of the pairs are both exceeded. For example, the pairs could be set at:

|         | high   | low    |
|---------|--------|--------|
| pair 1: | 10 ns. | 10 ns. |
| pair 2: | 19 ns. | 1 ns.  |
| pair 3  | 1 ns.  | 19 ns. |

This would assure that if either the high or low widths is greater than 19 ns., then β clock is always selected regardless of the duration of the other high or low widths. The number of pairs can be minimized by placing duty cycle requirements on the external clock waveform.

It is to be understood that the form of the invention shown and described is to be taken as presently preferred embodiments. Various modifications and changes may be made to each and every circuit element, without departing from the spirit and scope of the invention as set forth in the claims. For example, there may be more than two pulse width generators in order to allow selectability of three or more high pulse width signals connectable to a load device. Furthermore, the decision logic can take on many different forms, any of which would provide binary representation and multiplexer selectability of one of two (or more) signals of dissimilar high pulse durations. Still further, the pulse width generated signals can be formed by any instantaneous or near-instantaneous monstable or bistable-based circuits having set high pulse durations. It is intended that the following claims be interpreted to embrace all such modifications and changes and, accordingly, the specification and drawings are to be regarded in an illustrative rather than a restrictive sense.

What is claimed is:

1. An internal clock signal generation circuit, comprising:

a pulse width detector coupled to receive an external clock signal and compare an external clock pulse for each cycle of the external clock signal to a signal delayed from the external clock signal by a threshold time amount to produce a comparison result; and a pulse width generator connected to said external clock signal for generating an internal clock signal upon a load device, each cycle of said internal clock signal having a pulse width dependent upon said comparison result.

2. The internal clock signal generation circuit as recited in claim 1, wherein said pulse width detector comprises a decision logic circuit connected to receive said comparison result for producing a select signal dependent upon said comparison result and wherein said pulse width generator is connected to receive said select signal.

3. The internal clock signal generation circuit as recited in claim 1, wherein said internal clock signal comprises one of two possible clock signals of dissimilar pulse width durations.

4. The internal clock signal generation circuit as recited in claim 3, wherein said one of two possible clock signals is selected by a multiplexer coupled between said pulse width detector and said pulse width generator.

5. An internal clock signal generation circuit, comprising:

an external clock signal having an external clock high and a low pulse for each cycle of the external clock signal;

a pulse width detector coupled to receive said external clock signal and compare a duration of said external clock high pulse as well as said external clock low pulse with respective pulses of a signal delayed from the external clock signal by a threshold time amount, wherein said pulse width detector is adapted for producing a select signal corresponding to said comparison;

first and second pulse width generators coupled to receive said external clock signal and produce a respective first and second clock high pulse, said first and second clock high pulse having dissimilar pulse widths of duration greater than zero;

a multiplexer coupled to receive said select signal and said first and second clock high pulse and, based upon said select signal, said multiplexer is adapted for connecting said first clock high pulse as an internal clock signal to a load device if the duration of said external clock high pulse is less than a threshold amount.

6. The internal clock signal generation circuit as recited in claim 5, wherein said multiplexer is further adapted, based upon said select signal, for connecting said first clock high pulse to said load device if the duration of said external clock low pulse is less than said threshold amount.

7. The internal clock signal generation circuit as recited in claim 5, wherein said multiplexer is further adapted, based upon said select signal, for connecting said second clock high pulse to said load device if the duration of said external clock high pulse and the duration of said external clock low pulse are each greater than said threshold amount.

8. The internal clock signal generation circuit as recited in claim 5, wherein said pulse width detector comprises:

a delay circuit coupled to receive said external clock high and low pulse and produce said signal delayed from said external clock signal by a threshold time amount, said delayed signal comprising a delayed external clock high and low pulse;

a logic gate coupled to receive said external clock high and low pulse and said delayed external clock high and low pulse, wherein said logic gate is adapted for producing a binary signal corresponding to the presence or absence of timed overlap of said external clock high and low pulse with respective said delayed external clock high and low pulse;

a set-reset latching circuit coupled to receive said binary signal and produce a latched output to a decision logic; and a delay latching circuit coupled to receive an output from said decision logic, delay said binary signal by one clock cycle of said external clock, and produce a latched said select signal.

9. The internal clock signal generation circuit as recited in claim 5, wherein said first and second pulse width generators comprise first and second latching circuits, each having a set input terminal connected to a set signal and a reset input terminal connected to a reset signal, each said reset signal comprising said set signal of the respective latching circuit delayed by a delay interval, and wherein the delay interval of said second latching circuit is longer than the delay interval of said first latching circuit.

* * * * *